(12) United States Patent
Lim et al.

(10) Patent No.: US 11,555,978 B2
(45) Date of Patent: Jan. 17, 2023

(54) CAMERA MODULE WITH OPTICAL IMAGE STABILIZATION FUNCTION

(71) Applicant: MCNEX CO., LTD., Seoul (KR)

(72) Inventors: Jang Ho Lim, Seoul (KR); Jae Hoon Kim, Seoul (KR); Chang Il Jang, Seoul (KR); Jae Hun Jo, Seoul (KR); Ki Sung Yoo, Seoul (KR); Jeong Won No, Seoul (KR); Tae Youn Hwang, Seoul (KR)

(73) Assignee: MCNEX CO., LTD., Seoul (KR)

( * ) Notice: Subject to any disclaimer, the term of this patent is extended or adjusted under 35 U.S.C. 154(b) by 759 days.

(21) Appl. No.: 16/503,434

(22) Filed: Jul. 3, 2019

(65) Prior Publication Data
US 2020/0012068 A1 Jan. 9, 2020

(30) Foreign Application Priority Data

| Jul. 5, 2018 | (KR) | 10-2018-0078227 |
| May 28, 2019 | (KR) | 10-2019-0062365 |
| Jun. 13, 2019 | (KR) | 10-2019-0069771 |

(51) Int. Cl.
*G02B 7/02* (2021.01)
*G02B 27/64* (2006.01)
(Continued)

(52) U.S. Cl.
CPC .............. *G02B 7/026* (2013.01); *G02B 7/04* (2013.01); *G02B 13/001* (2013.01); *G02B 27/646* (2013.01); *G03B 13/36* (2013.01); *H04N 5/2254* (2013.01); *H04N 5/232* (2013.01); *H05K 1/181* (2013.01); *H05K 2201/05* (2013.01)

(58) Field of Classification Search
CPC ........ G02B 7/026; G02B 7/04; G02B 13/001; G02B 27/646; G03B 13/36; H04N 5/2254; H04N 5/232; H05K 1/181; H05K 2201/05
See application file for complete search history.

(56) References Cited

U.S. PATENT DOCUMENTS

| 9,264,618 B2 | 2/2016 | Kim |
| 9,729,793 B2 | 8/2017 | Kim |

(Continued)

FOREIGN PATENT DOCUMENTS

| CN | 102033387 A | 4/2011 |
| CN | 105022204 A | 11/2015 |

(Continued)

OTHER PUBLICATIONS

Korean office action dated Jun. 9, 2020 for Korean Application No. 10-2019-0062365.

(Continued)

*Primary Examiner* — William R Alexander
*Assistant Examiner* — Sharrief I Broome
(74) *Attorney, Agent, or Firm* — Insight Law Group, PLLC; Seung Lee

(57) ABSTRACT

The proposed invention relates to a camera module with an optical image stabilization function. A flexible printed circuit board (FPCB) electrically connected to an image sensor is implemented to serve as an electrical path and at the same time, serve to provide an elastic restoring force in directions of a plurality of axes, thereby further miniaturizing and lightening the camera module.

14 Claims, 16 Drawing Sheets

(51) Int. Cl.
*G02B 7/04* (2021.01)
*H04N 5/232* (2006.01)
*G02B 13/00* (2006.01)
*G03B 13/36* (2021.01)
*H05K 1/18* (2006.01)
*H04N 5/225* (2006.01)

(56) References Cited

U.S. PATENT DOCUMENTS

| | | | |
|---|---|---|---|
| 10,003,746 B2 | 6/2018 | Minamisawa | |
| 10,036,870 B2 | 7/2018 | Hee et al. | |
| 10,036,896 B2 | 7/2018 | Hee et al. | |
| 2011/0075999 A1 | 3/2011 | Chiu | |
| 2015/0070791 A1* | 3/2015 | Lam | G02B 7/005 |
| | | | 359/823 |
| 2016/0054578 A1* | 2/2016 | Dong | G02B 27/646 |
| | | | 359/557 |
| 2016/0161757 A1* | 6/2016 | Hee | G02B 7/026 |
| | | | 359/557 |
| 2016/0238856 A1* | 8/2016 | Sul | G02B 7/08 |
| 2018/0109660 A1* | 4/2018 | Yoon | G02B 13/0035 |
| 2019/0141248 A1 | 5/2019 | Hubert et al. | |
| 2020/0196447 A1 | 6/2020 | Mak | |

FOREIGN PATENT DOCUMENTS

| | | | |
|---|---|---|---|
| CN | 105025657 A | 11/2015 | |
| CN | 107315302 A | 11/2017 | |
| CN | 107340667 A * | 11/2017 | ............ G03B 5/00 |
| CN | 107340667 A | 11/2017 | |
| JP | 2010-096858 A | 4/2010 | |
| JP | 5535078 B2 | 5/2014 | |
| KR | 10-2013-0047350 A | 5/2013 | |
| KR | 10-2016-0063329 A | 6/2016 | |
| KR | 10-2016-0068133 A | 6/2016 | |
| KR | 10-2016-0089557 A | 7/2016 | |
| KR | 10-1640565 B1 | 7/2016 | |
| KR | 10-2018-0024145 A | 3/2018 | |
| KR | 10-2018-0042948 A | 4/2018 | |
| WO | 2017156562 A | 9/2017 | |

OTHER PUBLICATIONS

Chinese office action dated Nov. 3, 2020 for Chinese Application No. 201910609451.8.
Korean office action dated Aug. 10, 2020 for Korean Application No. 10-2019-0069771.
Notice of Allowance dated Jun. 14, 2021 for Korean Application No. 10-2019-0069771.
Chinese office action dated May 14, 2021 for Chinese Application No. 201910609451.8.

* cited by examiner

CAMERA MODULE WITH OPTICAL IMAGE STABILIZATION FUNCTION

CROSS-REFERENCE TO RELATED APPLICATION(S)

This application claims priority from Korean Patent Application No. 10-2018-0078227, filed on Jul. 5, 2018, No. 10-2019-0062365, filed on May 28, 2019 and No. 10-2019-0069771, filed on Jun. 13, 2019 in the Korean Intellectual Property Office, the disclosure of which is incorporated herein by reference in its entirety.

BACKGROUND

1. Field

The following description relates to optical image stabilization technology of a camera module.

2. Description of Related Art

An optical image stabilization (OIS) function is known in a camera module mounted on an electronic device. Korean Patent Publication No. 10-1640565 filed by the present applicant discloses a camera module in which a lens unit is supported with respect to a carrier by elastic forces of upper and lower springs. Such a method is one of lens shift methods in which a lens barrel is relatively shifted with respect to an image sensor which is advantageous in that a structure is generally simple but has a problem in that image distortion occurs.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to optical image stabilization technology of a camera module which has a simple structure and is capable of reducing image distortion.

In addition, the following description relates to an optical image stabilization structure having a simple structure and a small number of components.

A lower portion of a carrier and a lower portion of a housing are fixed to a flexible printed circuit board (FPCB) so as to be relatively movable, wherein an image sensor is mounted. Electric signal lines of the image sensor lead to the outside through the FPCB. An actuator configured to actuate the carrier receives a driving signal from the outside through the FPCB.

The FPCB may be made of a material which provides an elastic restoring force to restore the carrier to an initial position thereof with respect to the housing.

In additional aspect, the FPCB may include a fixing plate, an inner plate, and an elastic connection portion which connects the fixing plate and the inner plate. The fixing plate may be fixed to one side of the lower portion of the housing. The image sensor may be mounted on the inner plate, and the lower portion of the carrier may be fixed to a periphery of the image sensor. The elastic connection portion is disposed in a space between the fixing plate and the inner plate, provides an elastic restoring force between the fixing plate and the inner plate, electrically and mechanically connects the fixing plate and the inner plate, and has a zigzag shape.

In additional aspect, the elastic connection portion of the FPCB may have at least two rotationally symmetrical structures opposite to each other with respect to the inner plate.

In additional aspect, the elastic connection portion of the FPCB may include a stereotactic bent portion.

In additional aspect, the elastic connection portion of the FPCB may have a zigzag shape in a plan view and may include at least one stereotactic bent portion in a direction perpendicular to a planar surface.

In additional aspect, the elastic connection portion of the FPCB may include a plurality of zigzag connection portions which have a zigzag shape in a plan view and a vertical bent portion which bends in three dimensions and connects the zigzag connection portions in a direction perpendicular to a planar surface.

In additional aspect, the vertical bent portion of the elastic connection portion of the FPCB may further include a bending restriction portion (197) which restricts the bent portion from being bent.

In additional aspect, the camera module may further include a restoring spring to which an upper portion of the carrier and an upper portion of the housing are fixed and which couples the carrier to be movable in at least a first direction with respect to the housing and provides an elastic restoring force to restore the carrier to an initial position thereof with respect to the housing.

Other features and aspects will be apparent from the following detailed description, the drawings, and the claims.

Figure 1:
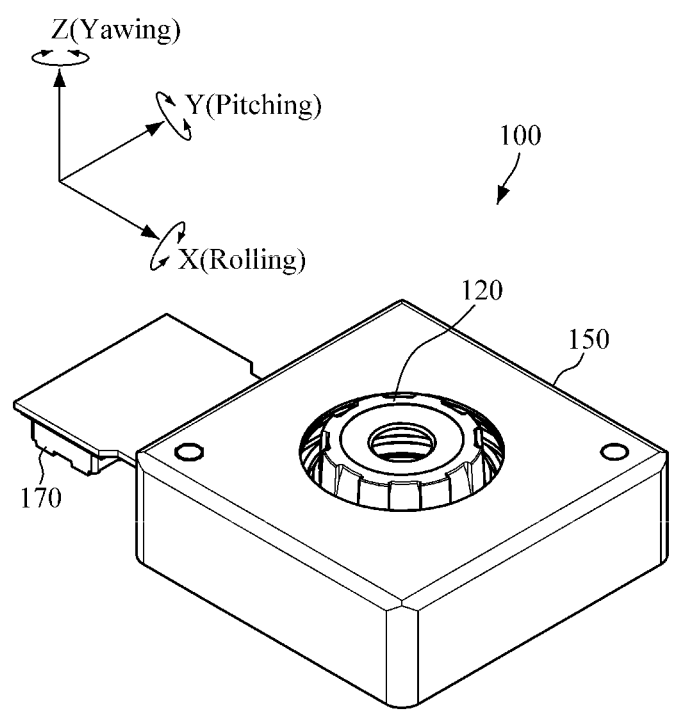
FIG. 1 is a perspective view illustrating a configuration of a camera module according to an exemplary embodiment of the proposed invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, exemplary embodiments will be described in detail with reference to the accompanying drawings so that the proposed invention can be readily implemented by those skilled in the art. The exemplary embodiments are illustrative for describing various aspects of the proposed invention and are not intended to limit the invention. It should be understood that when an element is referred to as being "connected" or "coupled" to another element in the present specification, the element may be directly connected or coupled to the other element or may be connected or coupled to the other element through other elements may be present.

[Description of FIG. 1]

Figure 2:
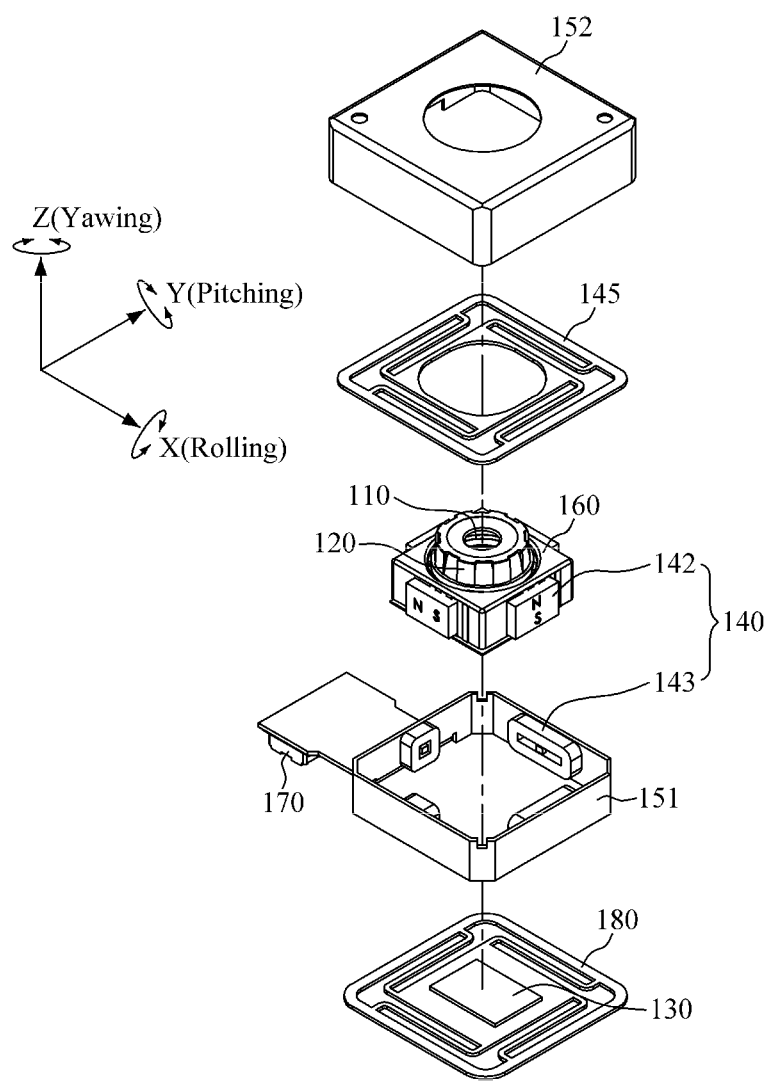
FIG. 2 is an exploded perspective view illustrating the camera module shown in FIG. 1.
Figure 3:
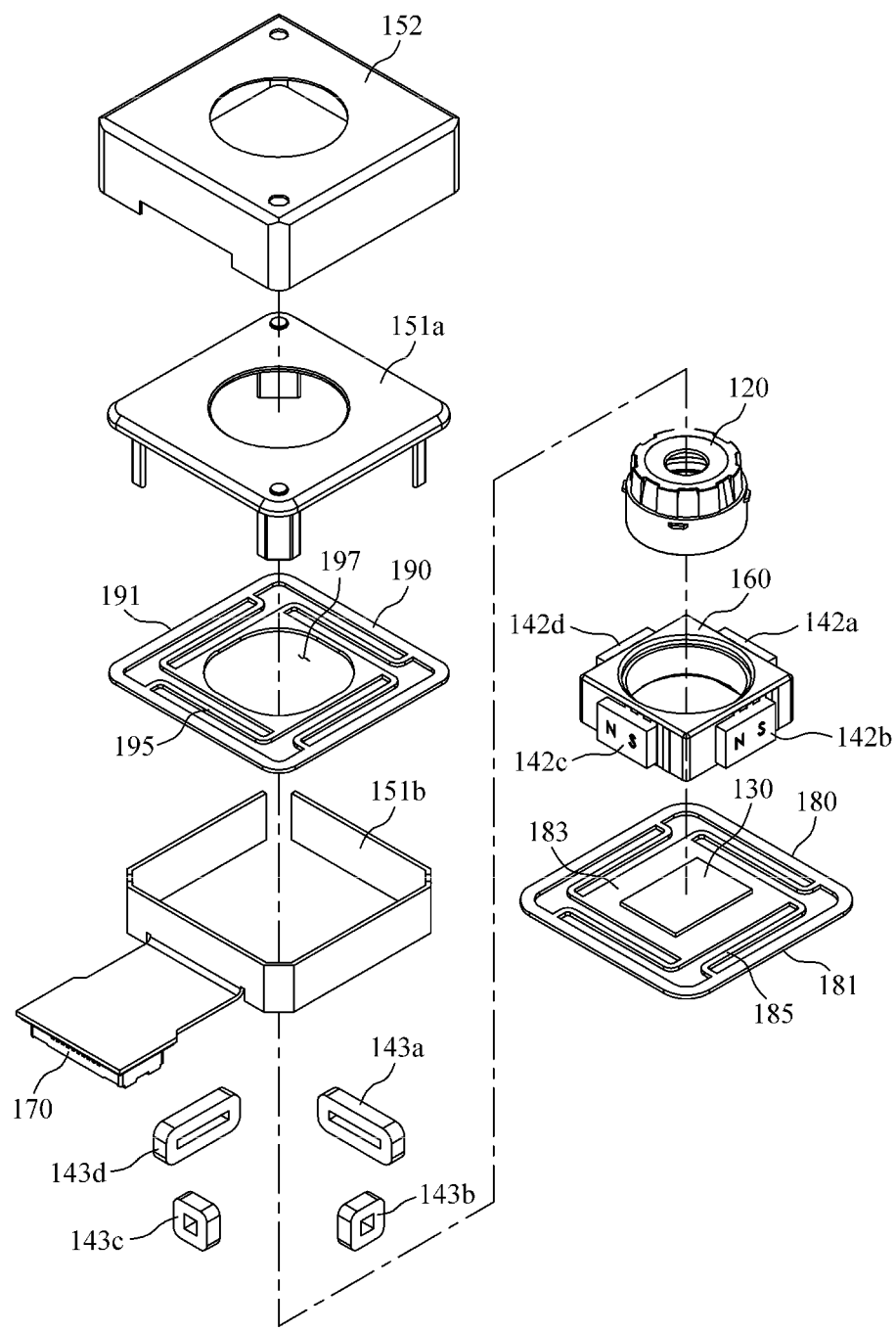
FIG. 3 is an exploded perspective view illustrating the camera module shown in FIG. 2 in more detail.

FIG. 1 is a perspective view illustrating a configuration of a camera module according to an exemplary embodiment of the proposed invention. FIG. 2 is an exploded perspective view illustrating the camera module shown in FIG. 1, and FIG. 3 is an exploded perspective view illustrating the camera module in more detail. As shown in the drawings, a camera module 100 according to the exemplary embodiment includes an image sensor 130, a lens barrel 120, a carrier 160, a housing 150, a flexible printed circuit board (FPCB) 180, and an actuator 140.

In an exemplary embodiment, the image sensor 130 is a complementary metal-oxide semiconductor (CMOS) image sensor. At least one lens 121 is fixedly accommodated in the lens barrel 120. The carrier 160 accommodates the lens barrel 120 therein. Although not shown, the carrier 160 may further include an autofocus driving structure for elevating the lens barrel 120 to adjust a focus thereof.

In the illustrated exemplary embodiment, the housing 150 includes an inner enclosure 151 which accommodates the actuator 140 and a module cover 152 which covers and protects the inner enclosure 151 from the outside. The inner enclosure 151 includes an enclosure cover 151a and an enclosure frame 151b. Coils 143 are attached and fixed to four inner surfaces of the inner enclosure 151. A plurality of coils 143 constituting a portion of the actuator 140 are fixedly installed on the four inner surfaces of the inner enclosure 151. An upper surface of the module cover 152 is open such that light is incident on at least one lens 121 accommodated and fixed in the lens barrel 120.

The image sensor 130 is mounted at a center of the FPCB 180, and a lower portion of the carrier 160 and a lower portion of the housing 150 are fixed to the FPCB 180 such that the carrier 160 is coupled to be moved in at least a first direction, i.e., a pitch direction. In the present specification, a movement refers to a movement for optical image stabilization (OIS) and includes a horizontal movement or rotation on an axis, but the proposed invention is not limited thereto.

According to an aspect, the FPCB 180 may be made of a material that provides an elastic restoring force to restore the carrier 160 to the initial position thereof with respective to the housing 150. For example, the FPCB 180 may be made of elastic plastic. In another example, an elastic restoring force may be provided by thickly patterning a metal circuit pattern. According to an aspect, the FPCB 180 may provide an elastic restoring force in a direction of a movement perpendicular to multiple axes or in a direction of rotation on the multiple axes. For example, the carrier 160 may be configured to be moved in a direction perpendicular to yaw and pitch axes or be tiltable in yaw and pitch directions with respect to the housing 150.

Meanwhile, according to an additional aspect of the invention, the FPCB 180 may be implemented to include a fixing plate 181, an inner plate 183, and an elastic connection portion 185. In this case, the fixing plate 181, the inner plate 183, and the elastic connection portion 185 may include a metal material. For example, a metal material in accordance with a designed elastic modulus may be patterned in the fixing plate 181, the inner plate 183, and the elastic connection portion 185 of the FPCB 180.

A lower portion of the inner enclosure 151, in which the plurality of coils 143 are fixed, is fixedly coupled along a circumference of the fixing plate 181. For example, the lower portion of the inner enclosure 151 of the housing 150 may be attached and fixedly coupled along the circumference of the fixing plate 181 through an adhesive resin made of an insulating material.

The image sensor 130 and a signal processing circuit are mounted on the inner plate 183. The lower portion of the carrier 160 is fixed to the inner plate 183. For example, lower portion of the carrier 160 may be attached and fixedly coupled along the circumference of the fixing plate 181 through an adhesive resin made of an insulating material. In addition, the inner plate 183 of the FPCB 180 may be embodied, for example, in a polygonal or circular shape.

In the illustrated exemplary embodiment, the actuator 140 includes four permanent magnets 142 which are fixedly mounted on four outer surfaces of the carrier and four coils 143 which are fixed at positions of four inner surfaces of the housing 150 and provides an attractive force or a repulsive force for driving, wherein the positions correspond to the permanent magnets. However, in a modified example, positions of the coils and the permanent magnets may be changed, and one or two pairs of the coil and the permanent magnet may be provided other than four pairs of the coil and the permanent magnet. For example, a plurality of permanent magnets 142 may be fixedly installed on the four outer surfaces of the carrier 160, and a plurality of coils 143 may be fixedly installed on four inner surfaces of the inner enclosure 151, which are disposed at positions opposite to the plurality of permanent magnets. In the illustrated exemplary embodiment, a size of coils 143a and 143d is different from a size of coils 143b and 143c. However, it can be seen that the coils 143a and 143d and the coils 143b and 143 may balance forces with respect to a diagonal tilting axis. Thus, a size of each coil may be changed according to a design.

According to another aspect, the camera module may further include a separate restoring spring 190. In the illustrated exemplary embodiment, an upper portion of the carrier 160 and an upper portion of the housing 150 are fixed to the restoring spring 190 such that the carrier 160 is coupled to be movable in at least a first direction. The restoring spring 190 provides an elastic restoring force to restore the carrier to the initial position thereof with respect to the housing. According to an aspect, the restoring spring 190 may provide an elastic restoring force in a direction of a movement perpendicular to multiple axes or in a direction of rotation on the multiple axes.

According to an aspect, the restoring spring 190 may be implemented to include a fixing plate 191, an inner plate 193, and an elastic connection portion 195. In this case, the fixing plate 191, the inner plate 193, and the elastic connection portion 195 may be made of an elastic metal material. An upper portion of the inner enclosure 151, in which the plurality of coils 143 are fixed, is fixedly coupled to the fixing plate 191. For example, the upper portion of the inner enclosure 151 may be attached and fixedly coupled to the fixing plate 191 through an adhesive resin made of an insulating material.

As shown in the drawings, protrusions protruding downward from four corners of the enclosure cover 151a pass through four corners of the fixing plate 191 of the restoring spring 190 and are fitted into the enclosure frame 151b. The module cover 152 is fitted to cover an assembly as assembled above. Thus, the upper portion of the housing 150 is fixed to the restoring spring 190.

The inner plate 193 has a lens barrel through-groove 197 formed in a center thereof, through which the lens barrel passes, and the upper portion of the carrier 160 is fixedly coupled thereto. For example, the upper portion of the carrier 160 may be fixed to the inner plate 193 through epoxy. The inner plate 193 of the restoring spring 190 may be embodied, for example, in a polygonal or circular shape. In this case, a portion of an outer periphery of the lens barrel 120 passes through the lens barrel through-groove 197 formed in the center of the inner plate 193 and is exposed.

In the illustrated exemplary embodiment, the carrier 160 is movably fixed to the housing 150 in such a manner that the upper portion thereof is fixed through the restoring spring 190 and the lower portion thereof is fixed through the FPCB 180. The carrier 160 is movably coupled to the housing 150 through the FPCB 180 and the restoring spring 190, and a simple camera shake correction structure is provided. Since the FPCB 180 mounted with the image sensor 130 is fixed to the lower portion of the carrier 160, an optical axis is maintained constant even when the carrier 160 is moved with respect to the housing 150, and thus, image distortion is prevented according to camera shake correction. In an exemplary embodiment, the carrier 160 may be moved in longitudinal and lateral directions of a planar surface perpendicular to pitch and yaw axes with respect to the housing 150. In another exemplary embodiment, the carrier 160 may be rotated or tilted on the pitch and yaw axes with respect to the housing 150. According to an additional aspect, the carrier 160 may be rotated or tilted on a roll axis with respect to the housing 150.

According to shapes of the elastic connection portion 195 of the restoring spring 190 and the elastic connection portion 185 of the FPCB 180, the carrier 160 maintains a constant position within the housing 150 by receiving a restoring force to return the carrier 160 to the original position thereof with respect to the roll, pitch and yaw axes and reflecting gravity in a state in which external vibration is absent.

When camera shake by a user or a vibration of a device is sensed by a gyro sensor mounted on an electronic device such as a smartphone or a drone, which is mounted with the camera module 100 according to the exemplary embodiment of the proposed invention, a controller (not shown) of the electronic device transmits a camera shake correction signal to the actuator 140.

A current flows through the coils 143 of the actuator 140 to generate an electromagnetic force according to the camera shake correction signal. A movement distance and a rotation angle (correction amount) of the carrier 160 are determined by intensity of the current flowing through each coil 143, and a movement direction and a rotation direction of the carrier 160 are determined by a direction of the current.

An attractive force or a repulsive force is applied to the permanent magnets 142 disposed at positions opposite the coils 143 by directions of electromagnetic field lines according to the direction of the current flowing the coils 143 of the actuator 140. Thus, the carrier 160 is moved in directions of three axes of yaw, roll, and pitch axes or is rotated on the three axes of the yaw, roll, and pitch axes. The strength of the attractive force or the repulsive force acting on the permanent magnet 142 is determined by an electromagnetic flux density according to the intensity of the current flowing through the coils 143 of the actuator 140, and thus, a degree of movement and a degree of rotation of the carrier 160 are determined.

Figure 4:
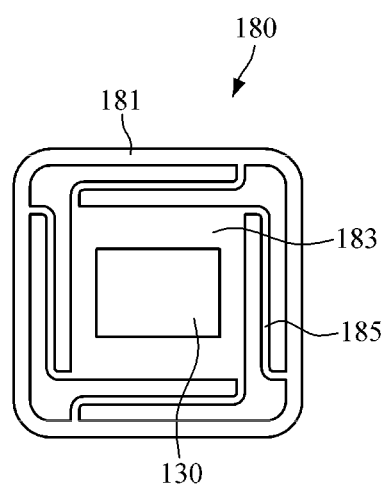
FIG. 4 is a plan view illustrating a configuration of a flexible printed circuit board (FPCB) according to an exemplary embodiment which is applicable to the camera module of the proposed invention.

[Description of FIG. 4]

FIG. 4 is a plan view illustrating a configuration of an FPCB according to an exemplary embodiment which is applicable to the camera module of the proposed invention. Referring to FIG. 4, an inner plate 183 of an FPCB 180 has a square shape. An elastic connection portion 185 is disposed in a space between a fixing plate 181 and the inner plate 183 and is connected between the fixing plate 181 and the inner plate 183 to serve as an electrical path. In addition, the elastic connection portion 185 may provide an elastic restoring force between the fixing plate 181 and the inner plate 183.

In the exemplary illustrated embodiment, the elastic connection portion 185 is illustrated as having four rotationally symmetrical structures opposite to each other with respect to the inner plate 183 but may have two rotationally symmetrical structures. As shown in the drawing, the elastic connection portion 185 may be implemented as a plate spring having a zigzag shape. The width, thickness, material, and shape of the zigzag shape should be appropriately selected according to a designed elastic force. In the illustrated exemplary embodiment, the elastic connection portion 185 of the FPCB 180 may provide an elastic restoring force in a direction of a movement perpendicular to three axes of yaw, roll, and pitch axes. In another example, the elastic connection portion 185 of the FPCB 180 may provide an elastic restoring force in a direction of rotation on the three axes of the yaw, roll, and pitch axes.

Figure 5:
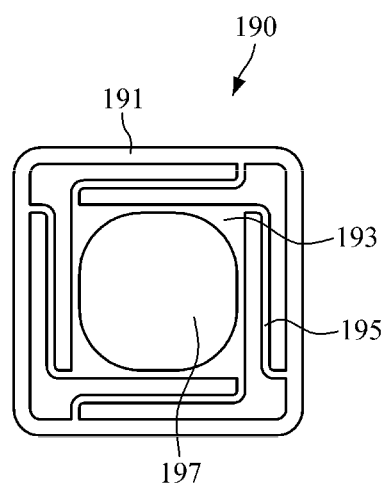
FIG. 5 is a plan view illustrating a configuration of a restoring spring according to an exemplary embodiment which is applicable to the camera module of the proposed invention.

[Description of FIG. 5]

FIG. 5 is a plan view illustrating a configuration of a restoring spring according to an exemplary embodiment which is applicable to the camera module of the proposed invention. Referring to FIG. 5, an inner plate 193 of a restoring spring 190 has a square shape, and a lens barrel through-groove 197, through which a lens barrel 120 passes, is formed in a center thereof.

An elastic connection portion 195 is disposed in a space between a fixing plate 191 and the inner plate 193 and is connected between the fixing plate 191 and the inner plate 193. The elastic connection portion 195 provides an elastic restoring force. In addition, the elastic connection portion 195 may serve as an electrical path.

In the exemplary illustrated embodiment, the elastic connection portion 195 is illustrated as having four rotationally symmetrical structures opposite to each other with respect to the inner plate 193 but may have two rotationally symmetrical structures. As shown in the drawing, the elastic connection portion 195 may be implemented as a plate spring having a zigzag shape. The width, thickness, material, and shape of the zigzag shape should be appropriately selected according to a designed elastic force. In the illustrated exemplary embodiment, the elastic connection portion 195 of the restoring spring 190 may provide an elastic restoring force in a direction of a movement perpendicular to three axes of yaw, roll, and pitch axes. In another example, the elastic connection portion 195 of the restoring spring 190 may provide an elastic restoring force in a direction of rotation on the three axes of the yaw, roll, and pitch axes.

Figure 6:
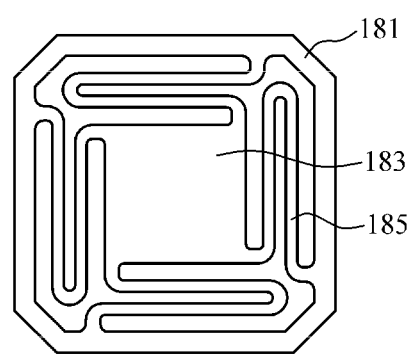
FIG. 6 is a plan view illustrating a configuration of an FPCB according to another exemplary embodiment which is applicable to the camera module of the proposed invention.
Figure 7:
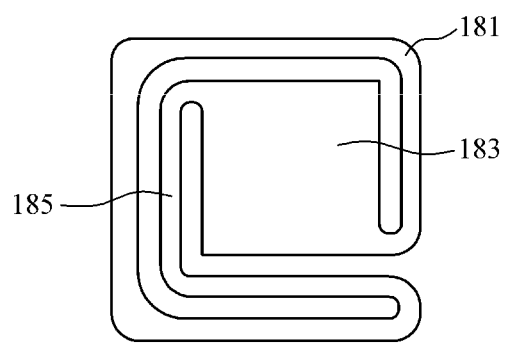
FIG. 7 is a plan view illustrating a configuration of an FPCB according to still another exemplary embodiment which is applicable to the camera module of the proposed invention.

FIG. 6 is a plan view illustrating a configuration of an FPCB or a restoring spring according to another exemplary embodiment of the camera module having the OIS function according to the present invention.

In the illustrated exemplary embodiment, the FPCB or the restoring spring has at least four rotationally symmetrical structures which are opposite to each other with respect to an inner plate. An elastic restoring force may be designed by a width of a zigzag or meandering shape, a width of a meandering arm, and a radius of curvature of a curved connection portion.

Figure 8:
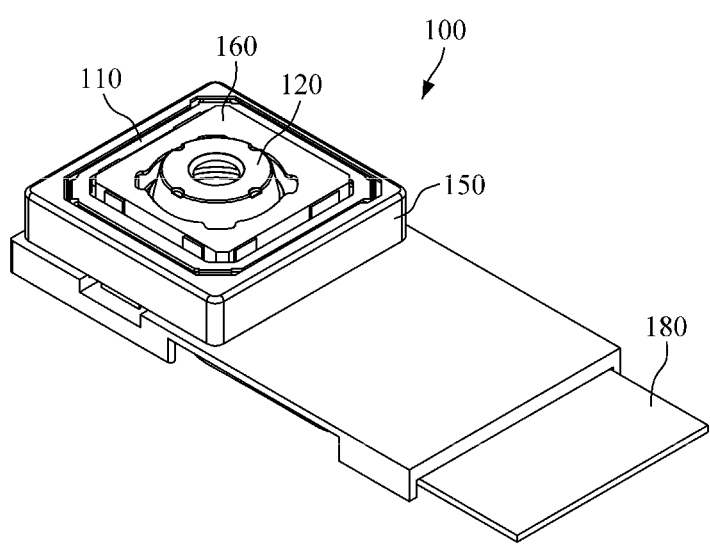
FIG. 8 is a perspective view illustrating a configuration of a camera module according to another embodiment of the proposed invention.

[Description of FIG. 8]

FIG. 8 is a perspective view illustrating a configuration of a camera module according to another embodiment of the proposed invention. The camera module according to the illustrated exemplary embodiment includes a lens barrel 120, a carrier 160, a housing 150, an FPCB 180. One or more lenses are fixed to the lens barrel 120. The carrier 160 connects the lens barrel 120 to an image sensor in a state of being aligned with an optical axis and being focused or is coupled to the lens barrel 120 through an autofocus structure. A power supply line, a control signal line, a driving signal line, an image signal line, and the like are disposed in the FPCB 180 toward the camera module. A connector 187 for connecting such electric lines to the outside is provided at one end of the FPCB 180.

In the illustrated exemplary embodiment, the carrier 160 is coupled to be tiltable on an X-axis and a Y-axis with respect to the housing 150. However, the proposed invention is not limited thereto, and the carrier 160 may be implemented through a lens shift method of shifting the carrier 160 in directions of the X-axis and the Y-axis with respect to the housing 150. In the illustrated exemplary embodiment, the X-axis and the Y-axes are present in a diagonal direction of the housing. In another embodiment, the X-axis and the Y-axis may also be present to pass through a center of each side of the housing.

Figure 9:
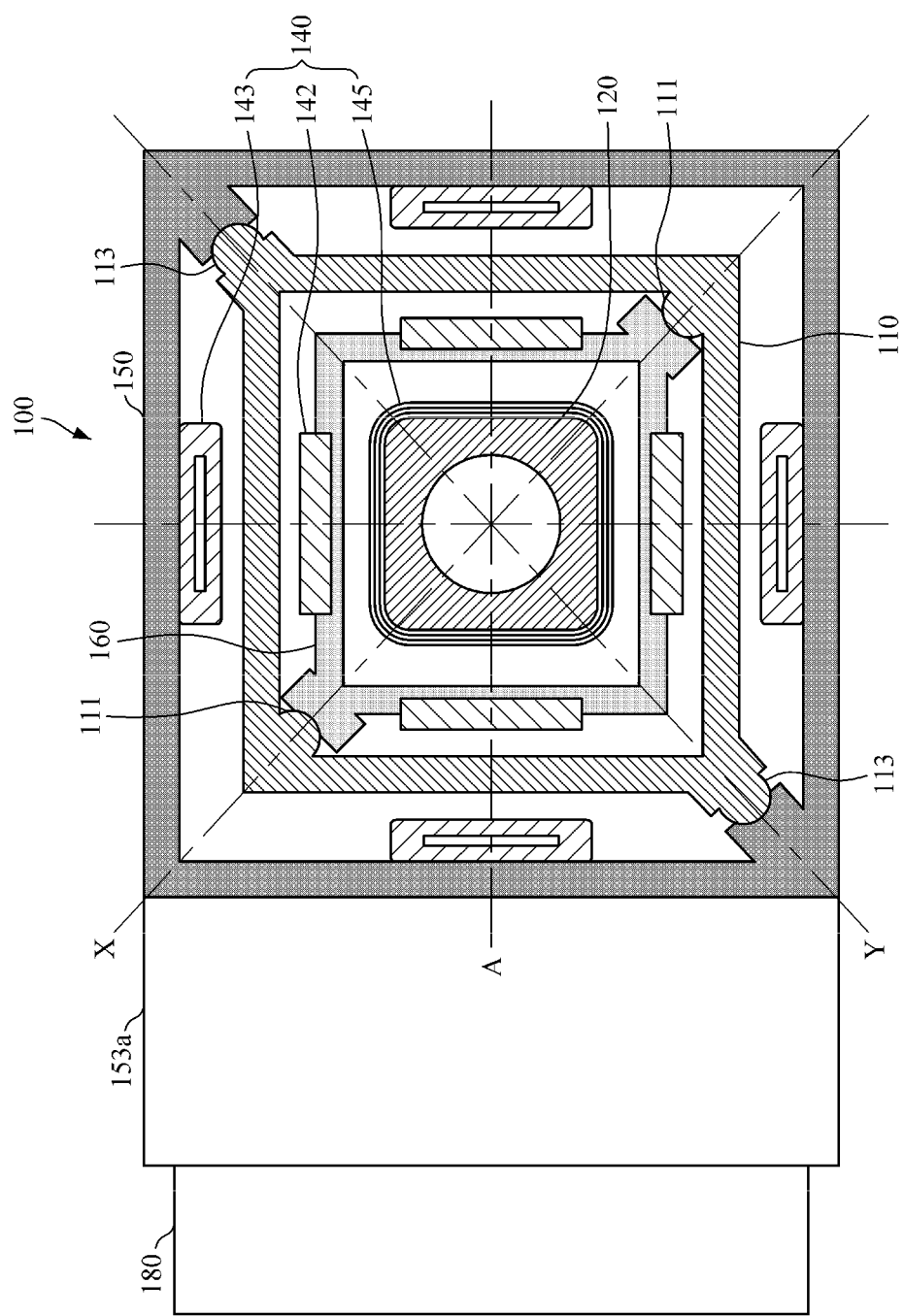
FIG. 9 is a horizontal cross-sectional view illustrating an internal configuration of a camera module according to an exemplary embodiment of the proposed invention.
Figure 10:
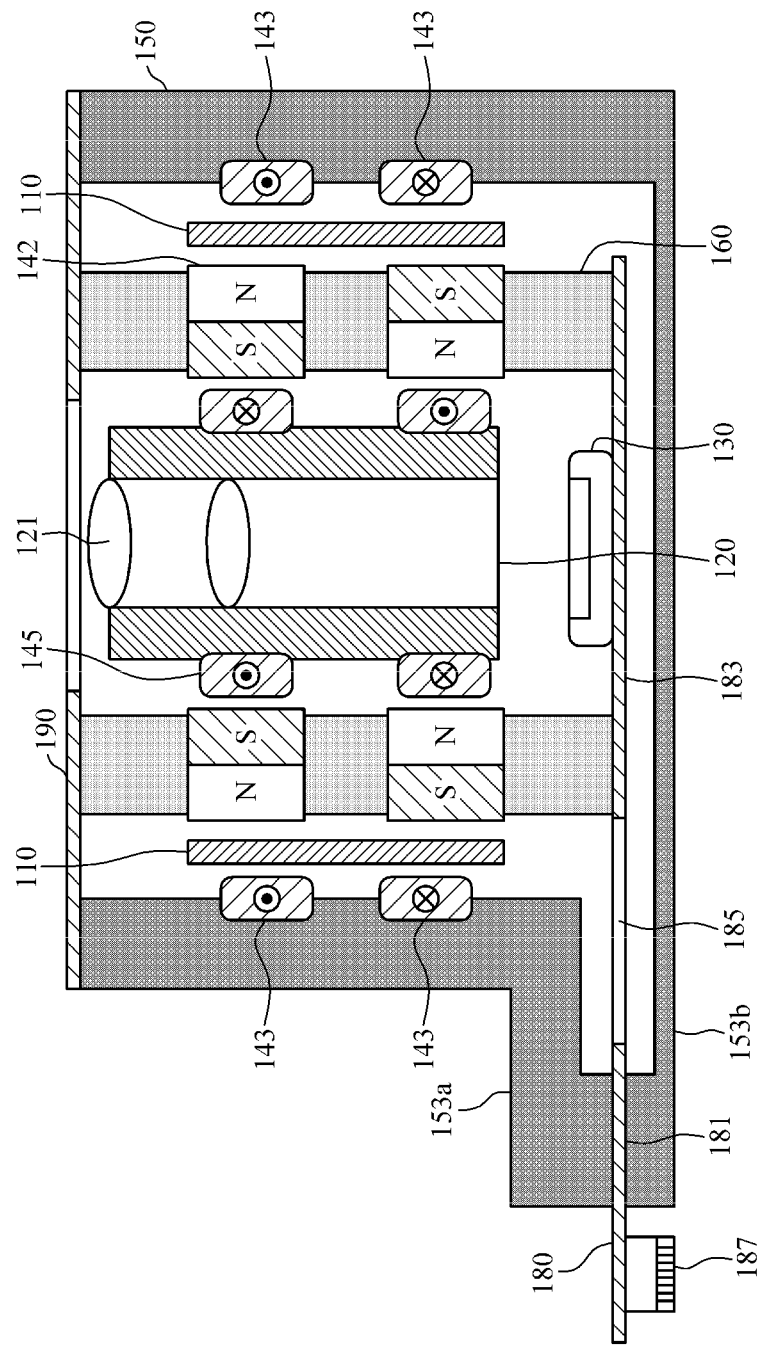
FIG. 10 is a side-sectional view taken along line A-A' in the exemplary embodiment shown in FIG. 9.

[Description of FIGS. 9 and 10]

FIG. 9 is a horizontal cross-sectional view illustrating an internal configuration of a camera module according to an exemplary embodiment of the proposed invention. FIG. 10 is a side-sectional view taken along line A-A' in the exemplary embodiment shown in FIG. 9. A tilting structure of the illustrated exemplary embodiment will be described with reference to FIGS. 9 and 10. A camera module 100 according to the exemplary embodiment includes a lens barrel 120, a carrier 160, a housing 150, an image sensor 130, an FPCB 180, and an actuator 140.

At least one lens 121 is fixedly accommodated in the lens barrel 120. The carrier 160 accommodates the lens barrel 120 therein. The carrier 160 may further include a focusing coil 145 which interacts with a permanent magnet 142 and elevates the lens barrel 120 to adjust a focus thereof.

According to an aspect, the camera module may further include an intermediate frame 110. The intermediate frame 110 is coupled to the carrier 160 at an inner side thereof to be tiltable and be coupled to the housing 150 at an outer side thereof to be tiltable. In an exemplary embodiment, the intermediate frame 110 includes a first hinge shaft 111 coupled to the carrier 160 at the inner side thereof and a second hinge shaft 113 coupled to the housing 150 at the outer side thereof. Accordingly, the carrier 160 is coupled to be tiltable on an X-axis and a Y-axis of the housing 150. In the illustrated exemplary embodiment, the carrier 160 is tilted on the X-axis and the Y-axis with respect to the housing 150 to compensate for camera shake, but the proposed invention may also be applied to a structure in which the carrier is shifted in directions of the X-axis and the Y-axis with respect to the housing to compensate for camera shake. In this case, the intermediate frame may be coupled to be shiftable in the direction of the X-axis with respect to the carrier and may be coupled to be shiftable in the direction of the Y-axis with respect to the housing. In another example, a tilting axis may be designed to pass through a middle of a side other than a diagonal direction.

The housing 150 accommodates and protects components therein. A plurality of coils 143 constituting a portion of the actuator 140 are fixedly installed on an inner surface of the housing 150. Permanent magnets 142 are installed at positions of an outer wall of the carrier 160 that correspond to the coils 143. The tilting of the carrier 160 with respect to the housing 150 is driven by a magnetic force between the coil 143 and the permanent magnet 142. Since the intermediate frame 110 is interposed between the carrier 160 and the housing 150, it is advantageous for the intermediate frame 110 to be designed as thin as possible.

The image sensor 130 is mounted at a center of the FPCB 180, and a lower portion of the carrier 160 and a lower portion of the housing 150 are fixed to the FPCB 180 such that the carrier 160 is coupled to be moved in at least a first direction, i.e., a pitch direction. In the present specification, a movement refers to a movement for OIS and includes a shift or tilting on an axis, but the proposed invention is not limited thereto.

In the illustrated exemplary embodiment, an upper base 153a and a lower base 153b are provided in a shape extending to one side of the housing 150. One end of the upper base 153a and one end of the lower base 153b are engaged with each other with a portion of a fixing plate 181 of the FPCB 180 therebetween and fix the FPCB 180.

According to an aspect, the FPCB 180 may be made of a material that provides an elastic restoring force to restore the carrier 160 to the initial position thereof with respect to the housing 150. For example, the FPCB 180 may be made of elastic plastic. In another example, an elastic restoring force may be provided by thickly patterning a metal circuit pattern. According to an aspect, the FPCB 180 may provide an elastic restoring force in a direction of a movement perpendicular to multiple axes or in a direction of rotation on the multiple axes. For example, the carrier 160 may be configured to be tiltable in yaw and pitch directions with respect to the housing 150. A configuration of the FPCB 180 will be described below in detail with reference to exemplary embodiments.

The actuator 140 relatively actuates the carrier 160 to which the lens barrel 120 is fixed with respect to the housing 150 to perform an OIS function. In the illustrated exemplary embodiment, the actuator 140 includes four permanent magnets 142 which are fixedly installed on four outer surfaces of the carrier 160 and four coils 143 which are fixed at positions of four inner surfaces of the housing 150 and provides an attractive force or a repulsive force, wherein the positions correspond to the permanent magnets. The coils 143 are fixed to the inner surfaces of the housing 150 and the permanent magnets 142 are fixed to outer walls of the carrier 160 in the illustrated exemplary embodiment, but the proposed invention is not limited thereto. In the coils 143 and the permanent magnets 142, an actuation structure in a direction of an X-axis may be configured such that the coil 143 is fixed to the inner surface of the housing 150 and the permanent magnet 142 is fixed to an outer wall of the intermediate frame. In another example, positions of the permanent magnet 142 and the coil 143 may be reversed.

Three, two, or one coil 143 and three, two, or one permanent magnet 142 may be provided other than four coils and four permanent magnets so as to secure a space for hall sensor installation or for other reasons. The coils or the permanent magnets do not necessarily need to be the same size, and two coils or permanent magnets or respective coils or permanent magnets may be designed to have different sizes. The number, size, and arrangement of the coils or the permanent magnets may be designed in accordance with the shape or size of a driving current.

When camera shake by a user or a vibration of a device is sensed by a position sensor, for example, a gyro sensor of an electronic device such as a smartphone or a drone, which is mounted with the camera module 100 according to the exemplary embodiment, a controller (not shown) of the electronic device transmits a camera shake correction signal to the actuator 140. However, the camera module 100 itself may be provided with the sensor and/or the controller. A current flows through the coils 143 of the actuator 140 to generate an electromagnetic force according to the camera shake correction signal. A tilting angle of the carrier 160 is determined by intensity of the current flowing through each coil 143, and a tilting direction of the carrier 160 is determined by a direction of the current. Thus, the carrier 160 is tilted in directions of yaw and pitch axes with respect to the housing.

The actuator 140 may further include a focusing coil 145 for autofocus (AF) driving. The lens barrel 120 is coupled to be elevated with respect to the carrier 160. For example, the lens barrel 120 may be coupled to the carrier 160 through a ball or an upper portion thereof or may be connected through a plate spring. The focusing coil 145 is wound around the lens barrel 120. According to an additional aspect of the proposed invention, the focusing coil 145 shares the permanent magnet 142 with the coil 143. That is, the permanent magnet 142 cooperates with the focusing coil 145 to automatically focus the lens barrel 120 and cooperates with the coil 143 to tilt the carrier 160 with respect to the housing 150.

Figure 11:
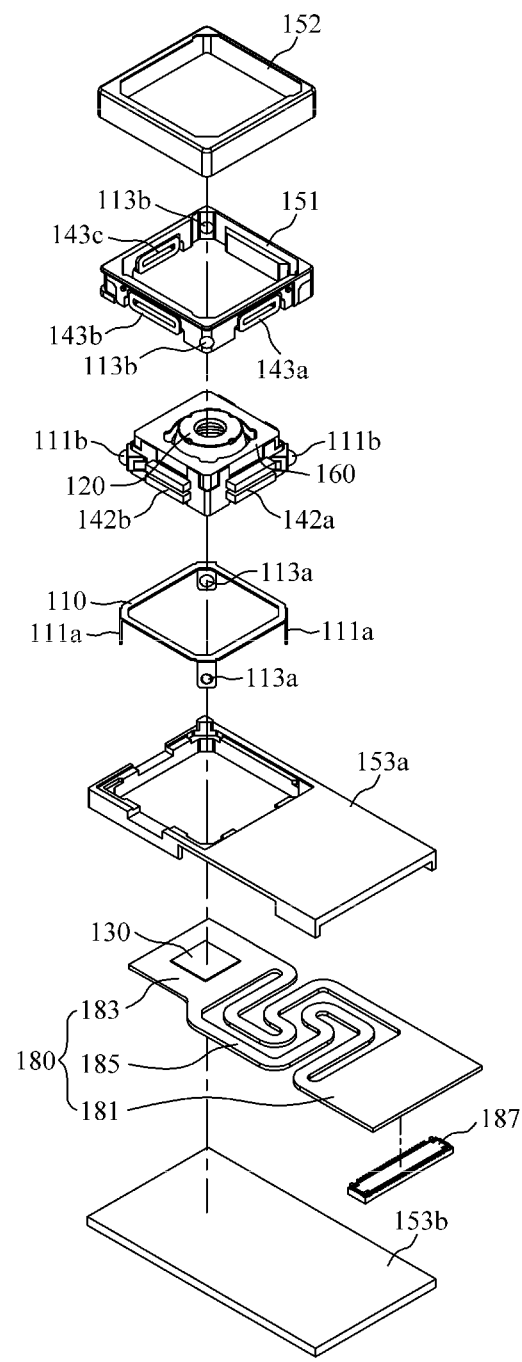
FIG. 11 is an exploded perspective view illustrating a configuration of a camera module according to another exemplary embodiment of the proposed invention.

[Description of FIG. 11]

FIG. 11 is an exploded perspective view illustrating a configuration of a camera module according to another exemplary embodiment of the proposed invention. As shown in the drawing, a camera module 100 according to the present exemplary includes housings 152 and 153, a carrier 160, an intermediate frame 110, an FPCB 180, and an actuator 140. The housing 150 includes an inner enclosure 151 and a module cover 152. In the illustrated exemplary embodiment, coils 143 are attached and fixed to three surfaces of the inner enclosure 151. The inner enclosure 151 is aligned and fixed to an edge of a hollow portion of an upper base 153a. In another example, the inner enclosure 151 may be molded integrally with the upper base 153a in a shape extending along the edge of the hollow portion. An inner enclosure 151 is fitted into the module cover 152.

In another exemplary embodiment, the module cover 152 may be aligned and fixed to the edge of the hollow portion of the upper base 153a or may be integrally molded in the shape extending along the edge of the hollow portion. The upper base 153a is coupled and fixed to a lower base 153b. When the camera module is mounted on other substrates or housings, the lower base 153b may be omitted.

Permanent magnets 142 are disposed and fixed at positions of the carrier 160 corresponding to the coils 143. Although a lens barrel is accommodated in the carrier 160 through an AF driving structure, the lens barrel is omitted in the drawing. The carrier 160 is coupled to be tiltable on an X-axis and a Y-axis in diagonal directions of the housings 152 and 153 with respect to the housings 152 and 153.

The intermediate frame 110 is coupled to the carrier 160 at an inner side thereof through a first hinge shaft 111 to be tiltable and be coupled to the inner enclosure 151 of the housing at an outer side thereof through a second hinge shaft 113 so as to be tiltable. In the illustrated exemplary embodiment, the hinge shafts includes balls and circular grooves formed outside corners of the carrier 160 and inside corners of the enclosure 151. However, the proposed invention is not limited thereto, and one of various structures for guiding rotational motion may replace the hinge shafts.

In an exemplary embodiment, the FPCB 180 includes a fixing plate 181, an inner plate 183, and an elastic connection portion 185.

The fixing plate 181 is fixed to one side of a lower portion of the housing. In the illustrated exemplary embodiment, the fixing plate 181 is engaged and fixed between one end of the upper base 153a and one end of the lower base 153b of the housing.

An image sensor 130 and a signal processing circuit (not shown) are mounted on the inner plate 183, and a lower portion of the carrier 160 is fixedly coupled along a circumference of the inner plate 183. For example, an upper portion of the carrier 160 may be fixed to the inner plate 183 through epoxy.

The elastic connection portion 185 is disposed in a space between the fixing plate 181 and the inner plate 183, provides an elastic restoring force between the fixing plate 181 and the inner plate 183, electrically and mechanically connects the fixing plate 181 and the inner plate 183, and has a zigzag shape.

Due to such a structure of the FPCB 180, the carrier 160 is fixedly coupled to the housing 150 in a movable state, i.e., a tiltable state in the illustrated exemplary embodiment. According to an aspect, since the image sensor 130 is attached to the inner plate 183 of the FPCB 180 and moves together with the carrier 160, despite motion compensation, an optical axis is always maintained constant with respect to the image sensor 130 so that image distortion is minimized.

The fixing plate 181, the inner plate 183, and the elastic connection portion 185 may include a metal material. For example, a metal material in accordance with a designed elastic modulus may be patterned in the fixing plate 181, the inner plate 183, and the elastic connection portion 185 of the FPCB 180.

The actuator 140 actuates a movement of the carrier 160 with respect to the housing 150. The actuator 140 relatively actuates the carrier 160 to which the lens barrel 120 is fixed with respect to the housing 150 to perform an OIS function. In the illustrated exemplary embodiment, the actuator 140 includes three permanent magnets 142 which are fixedly mounted on three outer surfaces of the carrier 160 and three coils 143 which are fixed at positions of three inner surfaces of the housing 150 and provides an attractive force or a repulsive force, wherein the positions correspond to the permanent magnets.

When camera shake is sensed by a sensor such as a gyro sensor, a control element calculates an amount of correction that cancels a movement and outputs a camera shake correction signal. A current flows through the coils 143 of the actuator 140 according to the camera shake correction signal, and an electromagnetic force is generated between the coil 143 and the corresponding permanent magnet 142, and thus, the carrier 160 is tilted in directions of yaw and/or pitch axes with respect to the housing.

The actuator 140 may further include an AF driving structure but has a structure similar to that of the exemplary embodiment of FIGS. 9 and 10, and thus detailed descriptions thereof will be omitted.

Figure 12:
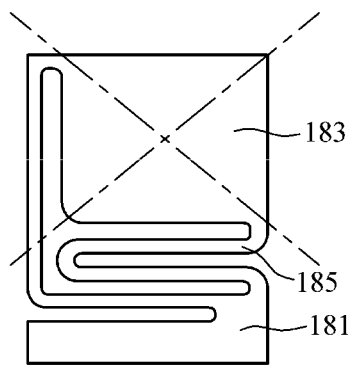
FIG. 12 is a plan view illustrating a configuration of an FPCB according to an exemplary embodiment of the proposed invention.

[Description of FIG. 12]

FIG. 12 is a plan view illustrating a configuration of an FPCB according to an exemplary embodiment of the proposed invention. In the illustrated exemplary embodiment, an alternate long and short dashed line indicates a rotation axis. In the illustrated exemplary embodiment, a fixing plate is present only at one side of a quadrangle, and an elastic connection portion is attached to two diagonal points of an inner plate from the fixing plate through a zigzag pattern. Such a structure provides an asymmetric elastic restoring force with respect to two tilting axes.

Figure 13:
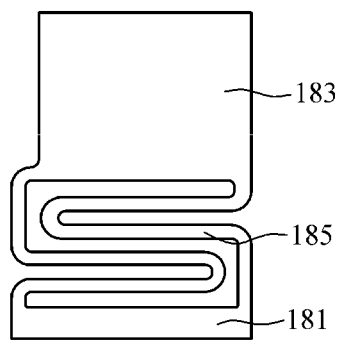
FIG. 13 is a plan view illustrating a configuration of an FPCB according to another exemplary embodiment of the proposed invention.

FIG. 13 is a plan view illustrating a configuration of an FPCB according to another exemplary embodiment of the proposed invention. In the illustrated exemplary embodiment, similarly, a fixing plate is present only at one side of a quadrangle, and an elastic connection portion is attached to two diagonal points of an inner plate from the fixing plate through a zigzag pattern. Unlike the structure of FIG. 12, a structure of the present exemplary embodiment is designed to provide a symmetrical elastic restoring force with respect to two tilting axes.

Figure 14A:
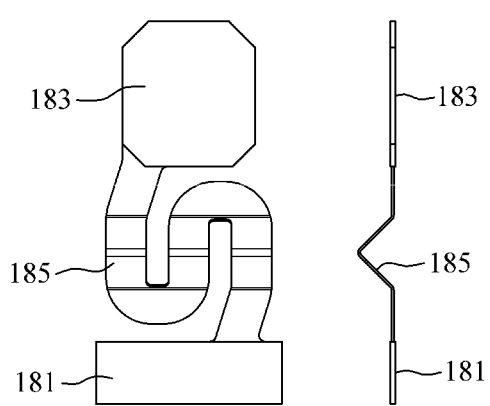
FIG. 14A shows a plan view and a side view illustrating a configuration of an FPCB according to still another embodiment of the present invention.
Figure 14B:
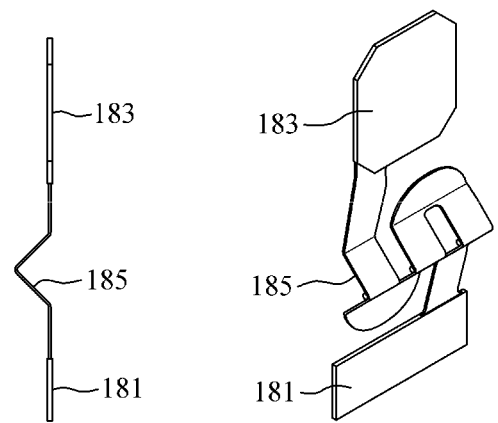
FIG. 14B is a perspective view of the FPCB.

FIG. 14A shows a plan view and a side view illustrating a configuration of an FPCB according to still another embodiment of the present invention, and FIG. 14B is a perspective view thereof. As shown in the drawing, in the illustrated exemplary embodiment, an elastic connection portion 185 has a zigzag shape in a plan view and has one stereotactic bent portion in a direction perpendicular to a planar surface. In a state in which a fixing plate 181 is fixed to one side surface of a housing and a carrier 160 of which a movement is restricted by a tilting axis with respect to the housing 150 is fixed to an inner plate 183, a tilting operation of the carrier 160 is confined by an active driving force of an actuator 140 and a restoring force of the elastic connection portion having the zigzag shape in the plan view and having the stereotactic bent portion in the direction perpendicular to the planar surface.

Figure 15C:
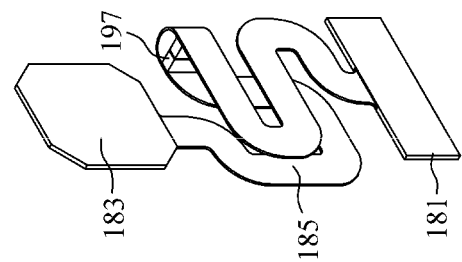
FIG. 15C is a perspective view of the FPCB.
Figure 15B:
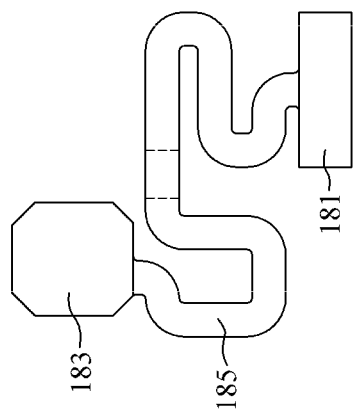
FIG. 15B is a development view of the FPCB.
Figure 15A:
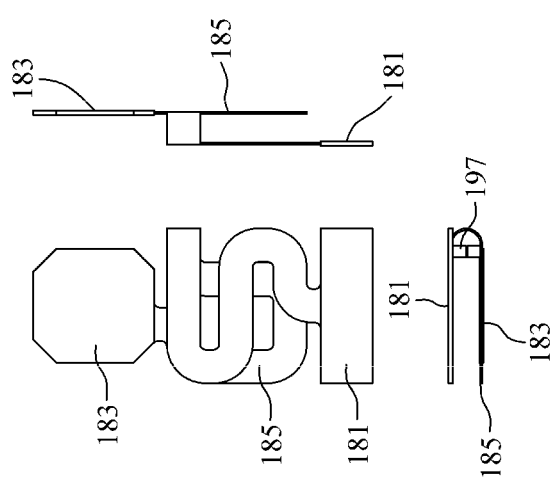
FIG. 15A shows a plan view, a front view, and a side view illustrating a configuration of an FPCB according to yet another exemplary embodiment of the proposed invention.

FIG. 15A shows a plan view, a front view, and a side view illustrating a configuration of an FPCB according to yet another exemplary embodiment of the proposed invention, FIG. 15B is a development view thereof, and FIG. 15C is a perspective view thereof. As shown in the drawings, in the illustrated exemplary embodiment, an elastic connection portion 185 has a structure in which two plate springs having a zigzag shape in a plan view are connected through one stereotactic bent portion in a direction perpendicular to a planar surface. A movement of the stereotactic bent portion may be restricted through a configuration of a bending restriction portion 197 having a shape of a block or fixing piece, which is disposed inside the stereotactic bent portion and, for example, fills in the stereotactic bent portion. Elastic intensity in a direction of the bending restriction portion 197 may be adjusted by the bending restriction portion 197.

Figure 16C:
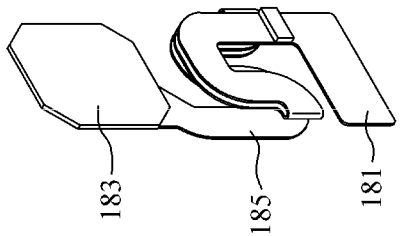
FIG. 16C is a perspective view of FPCB.
Figure 16B:
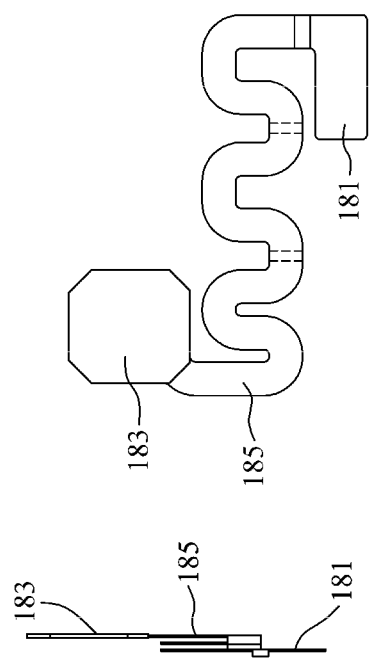
FIG. 16B is a development view of FPCB.
Figure 16A:
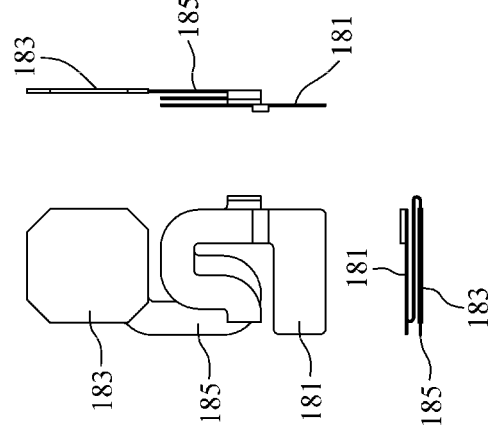
FIG. 16A shows a plan view, a front view, and a side view illustrating a configuration of an FPCB according to yet another exemplary embodiment of the proposed invention.

FIG. 16A shows a plan view, a front view, and a side view illustrating a configuration of an FPCB according to yet another exemplary embodiment of the proposed invention, FIG. 16B is a development view thereof, and FIG. 16C is a perspective view thereof. As shown in the drawings, in the present exemplary embodiment, an elastic connection portion 185 has a structure in which three plate springs having a zigzag shape in a plan view are connected through two stereotactic bent portions in a direction perpendicular to a planar surface. A movement of the stereotactic bent portion may be restricted through a configuration of a bending restriction portion having a shape of a block or fixing piece, which is disposed inside the stereotactic bent portion and, for example, fills in the stereotactic bent portion.

According to the proposed invention, provided is an optical image stabilization structure which is advantageous in reductions in size and weight. Furthermore, despite a simple structure, image distortion can also be reduced.

The various exemplary embodiments disclosed in the present specification and the drawings have been presented to help comprehension of the proposed invention and are not intended to limit the scope of the various exemplary embodiments of the proposed invention. Therefore, it should be construed that, in addition to the exemplary embodiments disclosed herein, all modifications and changes or modified and changed forms derived from the technical idea of various exemplary embodiments of the proposed invention fall within the scope of the proposed invention.

What is claimed is:

1. A camera module with an optical image stabilization function, comprising:
    a lens barrel;
    a carrier which accommodates a lens barrel therein;
    a housing which accommodates the carrier therein;
    an image sensor;
    a flexible printed circuit board (FPCB) in which the image sensor is mounted therein and a lower portion of the carrier and a lower portion of the housing are fixed such that the carrier is coupled to be movable in at least a first direction with respect to the housing; and
    an actuator which activates a movement of the carrier with respect to the housing,
    wherein the FPCB includes a fixing plate which is fixed to one side of the lower portion of the housing, an inner plate on which the image sensor is mounted and to which the lower portion of the carrier is fixed, and an elastic connection portion which extends from the fixing plate to the inner plate in a zigzag shape, provides an elastic restoring force between the fixing plate and the inner plate, and electrically and mechanically connects the fixing plate and the inner plate, wherein the elastic connection portion has the zigzag shape in a plan view and includes a stereotactic bent portion in a direction perpendicular to a planar surface of the inner plate.

2. The camera module of claim 1, wherein the FPCB is made of a material which provides an elastic restoring force to restore the carrier to an initial position thereof with respect to the housing.

3. The camera module of claim 1, wherein the elastic connection portion of the FPCB has at least two rotationally symmetrical structures opposite to each other with respect to the inner plate.

4. The camera module of claim 1, wherein the elastic connection portion of the FPCB is a plate spring having a zigzag shape.

5. The camera module of claim 1, further comprising a restoring spring to which an upper portion of the carrier and an upper portion of the housing are fixed and which couples the carrier to be movable in at least a first direction with respect to the housing and provides an elastic restoring force to restore the carrier to an initial position thereof with respect to the housing.

6. The camera module of claim 5, wherein the restoring spring includes a fixing plate to which the upper portion of the housing is fixed, an inner plate which has a lens barrel through-groove formed in a center thereof through which the lens barrel passes and to which the upper portion of the carrier is fixed, and an elastic connection portion which is disposed in a space between the fixing plate and the inner plate, couples the carrier to be movable in the at least a first direction with respect to the housing, and provides the elastic restoring force to restore the carrier to the initial position thereof with respect to the housing.

7. The camera module of claim 6, wherein the elastic connection portion of the restoring spring has at least two rotationally symmetrical structures in directions opposite to each other with respect to the inner plate.

8. The camera module of claim 6, wherein the elastic connection portion of the restoring spring is a plate spring having a zigzag shape.

9. The camera module of claim 1, wherein the FPCB couples the carrier to the housing so as to be rotatable on three axes of roll, pitch, and yaw axes with respect to the housing, and the actuator actuates rotation on the three axes.

10. The camera module of claim 1, further comprising an intermediate frame which includes a first hinge shaft coupled to the carrier at an inner side thereof and a second hinge shaft coupled to the housing at an outer side thereof.

11. A camera module with an optical image stabilization function, comprising:
a lens barrel;
a carrier which accommodates a lens barrel therein;
a housing which accommodates the carrier therein;
an image sensor;
a flexible printed circuit board (FPCB) in which the image sensor is mounted therein and a lower portion of the carrier and a lower portion of the housing are fixed such that the carrier is coupled to be movable in at least a first direction with respect to the housing; and
an actuator which activates a movement of the carrier with respect to the housing,
wherein the FPCB includes a fixing plate which is fixed to one side of the lower portion of the housing, an inner plate on which the image sensor is mounted and to which the lower portion of the carrier is fixed, and an elastic connection portion which extends from the fixing plate to the inner plate in a zigzag shape, provides an elastic restoring force between the fixing plate and the inner plate, and electrically and mechanically connects the fixing plate and the inner plate,
wherein the elastic connection portion includes a plurality of zigzag connection portions which have the zigzag shape in a plan view and a vertical bent portion which bends in three dimensions and connects the zigzag connection portions in a direction perpendicular to a planar surface of the inner plate.

12. The camera module of claim 11, wherein the vertical bent portion further includes a bending restriction portion which restricts a movement of the bent portion.

13. The camera module of claim 1, wherein the elastic connection portion has the zigzag shape in the direction perpendicular to the planar surface of the inner plate.

14. The camera module of claim 1, wherein the elastic connection portion has an undulation in the direction perpendicular to the planar surface of the inner plate.

* * * * *